(12) United States Patent
Lee

(10) Patent No.: US 9,024,321 B2
(45) Date of Patent: May 5, 2015

(54) CONDUCTIVE PARTICLE AND DISPLAY DEVICE INCLUDING THE SAME

(71) Applicant: Samsung Display Co., Ltd., Yongin, Gyeonggi-Do (KR)

(72) Inventor: Dae-Geun Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/035,481

(22) Filed: Sep. 24, 2013

(65) Prior Publication Data

US 2014/0319554 A1 Oct. 30, 2014

(30) Foreign Application Priority Data

Apr. 29, 2013 (KR) .......................... 10-2013-0047554

(51) Int. Cl.
*H01L 29/04* (2006.01)
*B29C 65/48* (2006.01)

(52) U.S. Cl.
CPC ........... *B29C 65/487* (2013.01); *B29C 65/4855* (2013.01)

(58) Field of Classification Search
CPC . H01L 27/32; H01L 27/3237; H01L 27/3244; H01L 27/3293
USPC ................................................. 257/59, 72, 91
See application file for complete search history.

(56) References Cited

U.S. PATENT DOCUMENTS

| 8,395,052 B2 | 3/2013 | Ishimatsu et al. |
| 2005/0275617 A1* | 12/2005 | Murooka ....................... 345/107 |
| 2012/0013615 A1* | 1/2012 | Mizokami et al. ............ 345/419 |

FOREIGN PATENT DOCUMENTS

| JP | 05-012916 | 1/1993 |
| KR | 100719810 B1 | 5/2007 |
| KR | 10-2011-0034606 | 5/2011 |
| KR | 1020120076182 A | 7/2012 |

* cited by examiner

*Primary Examiner* — Brook Kebede
(74) *Attorney, Agent, or Firm* — Innovation Counsel LLP

(57) ABSTRACT

A conductive particle comprising a polyhedral shape in which two neighboring sides among a plurality of sides form an intersection line, and two sides meeting on the intersection line form an angle.

6 Claims, 6 Drawing Sheets

CONDUCTIVE PARTICLE AND DISPLAY DEVICE INCLUDING THE SAME

CROSS-REFERENCE TO RELATED APPLICATION

This application claims priority to and the benefit of Korean Patent Application No. 10-2013-0047554 filed in the Korean Intellectual Property Office on Apr. 29, 2013, the entire contents of which application are incorporated herein by reference.

BACKGROUND (a) Field

The present disclosure of invention relates to a conductive particle and a display device including the same.

(b) Description of Related Technology

With increasing density of monolithically integrated circuits (IC's) and the like, it becomes desirable to provide high density interconnect between the IC's (or equivalent) and substrates to which they are operatively mounted and electrically coupled. In one class of endeavor, a circuit access material (e.g., an anisotropic conductive film, or ACF for short) is provided having a dispersion of electrically conductive particles embedded in an insulation film that also includes an adhesive. Such an ACF may be used for interconnect of high density circuit members such as providing interconnect between electrical connection pads on the substrate of a liquid crystal display (LCD) and corresponding terminals of a tape carrier package (TCP). Such an ACF may alternatively or additionally be used for providing high density interconnect access between a flexible printed circuit (FPC) and a tape carrier package (TCP), or access between a flexible printed circuit (FPC) and a printed wires plate (e.g., a printed circuit board).

The circuit access material must be electrically engaged with by means an ACF-penetrating electrode. More specifically, such penetrating electrodes may be provided on the substrate of a display panel, or in the form of IC packaging terminals (e.g., IC bumps) and/or as interconnect parts of a flexible printed circuit (FPC). Yet more specifically, a penetrateable insulative film such as an oxidized film is formed on an electrode surface to serve as a penetrateable connection barrier and then appropriate means are provided for conductively penetrating through the connection barrier or not in respective locations where electrical connections are respectively desired or not.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

In accordance with the present disclosure of invention, sharp edged and thus film-penetrating polyhedral conductive particles are provided as part of an Anisotropic Conductive Film (ACF) for conductively penetrating through a connection barrier provided under the ACF or not so penetrating in respective locations where electrical connections are respectively desired or not. A display device including the ACF having the polyhedral conductive particles (PCP's) is also provided in accordance with the present disclosure.

An exemplary embodiment of the present teachings provides a conductive particle in which two neighboring exterior sides (can be flat sides or convex sides) from among a plurality of exterior sides meet to form an intersection line. The respective tangents at the meeting line of the two sides form a sharp angle.

In one embodiment, surfaces showing the polyhedral shape of the conductive particle are exposed to the outside.

A cross-section of the conductive particle may include sides of a polygon.

The conductive particle may be one of a tetrahedron and a hexahedron.

Another exemplary embodiment provides a display device including: a first electrode; a barrier layer provided on the first electrode; a anisotropic conductive film provided on the barrier layer, the anisotropic conductive film (ACF) including a plurality of substantially same conductive particles dispersed through an insulative adhesive material forming the bulk of the ACF; and a second electrode provided above the conductive film, wherein in each of the conductive particles, two neighboring faces from among a plurality of side faces meet to form an intersection line, and the angle defined by the meeting of the two faces is a polyhedral shape forming angle.

At least a part of the intersection line in the conductive particle directly contacts the first electrode.

There is a plurality of intersection lines in the conductive particle, and an intersection point at which the intersection lines meet, where this sharp intersection point may directly contact the first electrode.

The display device may include a plurality of conductive particles comprising the conductive particle, wherein the conductive films comprises an electrically insulation film disposed between the conductive particles.

Surfaces showing the polyhedral shape of the conductive particle may contact the insulation film The barrier layer may be an oxide film.

According to a method the embodiment of the present disclosure of invention, a the bonding pressure applied by way of a being-mounted IC or other such component is concentrated by the wedge shape of the meeting faces on the compressed portion because of the configuration of the polyhedral shaped conductive particle to thereby increase contact force and reliability to a sufficient level to assuredly penetrate a regardless of the barrier layer formed on around the electrode (e.g., substrate pad).

DETAILED DESCRIPTION

Figure 1:
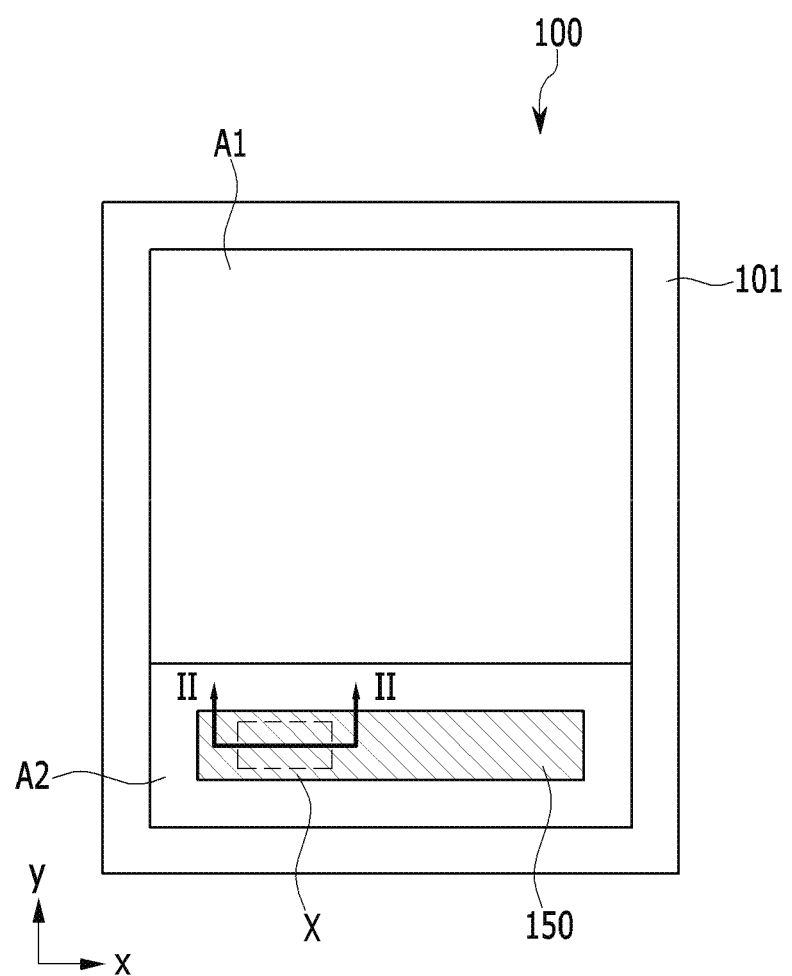
FIG. 1 shows a top plan view of a display device according to an exemplary embodiment of the present disclosure of invention.

The present disclosure of invention will be provided more fully hereinafter with reference to the accompanying drawings, in which exemplary embodiments are shown. However, it is to be understood that the present teachings are not limited to the disclosed embodiments, but, on the contrary, the present teachings are intended to cover various modifications. As those skilled in the art would realize in light of this disclosure, the described embodiments may be modified in various different ways, all without departing from the spirit or scope of the present teachings.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. Like reference numerals designate like elements throughout the specification.

Figure 2:
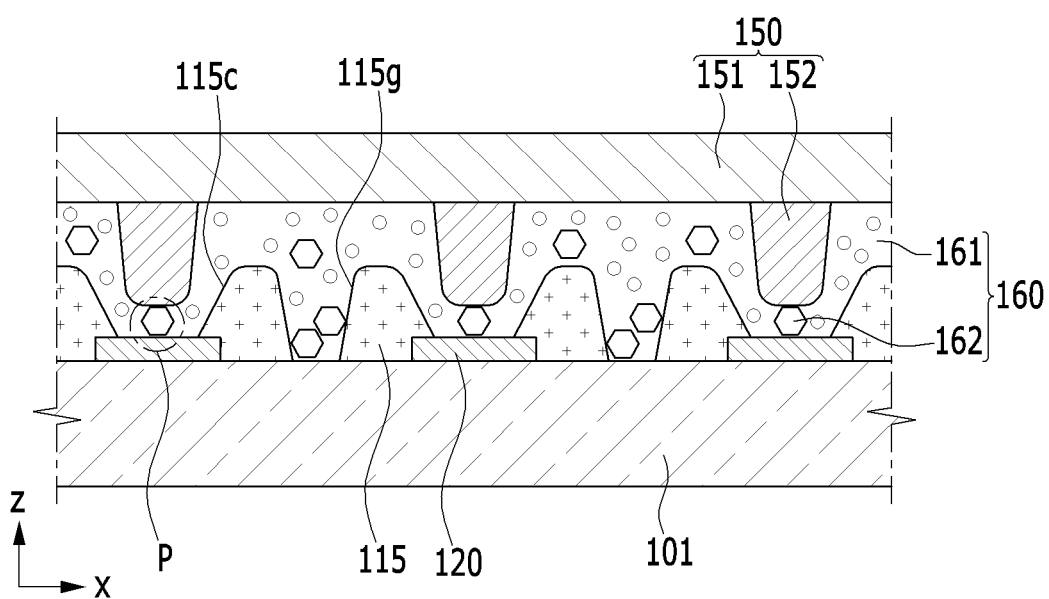
FIG. 2 shows a cross-sectional view with respect to a line II-II of FIG. 1.
Figure 3:
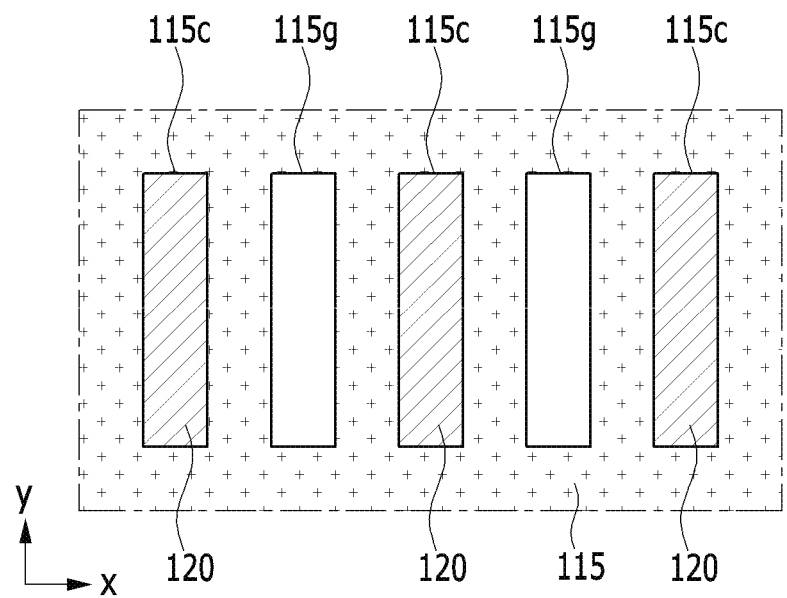
FIG. 3 shows an enlarged view of an X area of FIG. 1.

FIG. 1 shows a top plan view of a display device (e.g., a Liquid Crystal Display (LCD) device) according to an exemplary embodiment. FIG. 2 shows a cross-sectional view with respect to a line II-II of FIG. 1. FIG. 3 shows an enlarged view of an X area of FIG. 1.

Referring to FIG. 1 to FIG. 3, the display device 100 includes a substrate 101, one or more interconnect pads 120 disposed on the substrate, a patterned insulation layer 115 disposed on the interconnect pad(s), a driving circuit 150 having ACF-penetrating terminals 152 disposed on and penetrating an Anisotropic Conductive Film (ACF) 160 which is interposed between the driving circuit 150 and the substrate 101.

The substrate 101 is made of a light-passing electrically insulative material such as for example a transparent glass material having silicon dioxide (SiO2) as a main ingredient. However, the material of the substrate 101 is not restricted thereto, and it may be formed with transparent plastic. The plastic substrate is formed with an insulating organic material, and it can be formed with an organic material selected from a group including polyethersulphone (PES,), polyacrylate (PAR), polyetherimide (PEI), polyethylene naphthalate (PEN), polyethylene terephthalate (PET), polyphenylene sulfide (PPS), polyarylate, polyimide, polycarbonate (PC), triacetate cellulose (TAC), and cellulose acetate propionate (CAP). Also, the substrate 101 can be made of a metal or can be formed in a foil shape.

An image displaying area A1 and a non-displaying area A2 are defined on the substrate 101 of the display device. FIG. 1 shows the non-display area A2 disposed at a first edge of the display area A1. However, the present teachings are not restricted to this configuration. That is, the non-display area A2 can be provided at the first edge of the display area A1 and another edge facing the first edge, and it can be disposed to wrap the display area A1.

A plurality of pixels (not shown) for outputting electrically controlled points of light (e.g., controlled R, G, B source points) are formed in the display area A1 so that a user may perceive and electronically defined image. An electrode configuration for generating an electric field or a light emitting element for converting electricity into light by the flow of a current can be formed so that the pixel may output the desired amount and/or color of light.

A plurality of spaced apart interconnect pads 120 are disposed in the non-display area A2. At least some of the pads 120 may be used to transmit respective electrical signals and/or power signals to or from the display area A1. For example, some of the electrical signals generated by the driving circuit 150 and transmitted to the display area A1 through the pads 120 may include data line driving signals and/or gate line driving signals. As another example, some of the electrical signals received from the display area A1 for processing by the driving circuit 150 may include touch sensing signals.

Respective pads 120 are electrically connected to corresponding terminals 152 of the driving circuit 150 by way of conductive particles 162 included in the anisotropic conductive film 160. More specifically, the anisotropic conductive film 160 includes a film 161 of insulation material with conductive particles 162 distributed therein. Here, the insulation film 161 may include a heat or otherwise activateable (e.g., pressure) adhesive material. The adhesive material of insulation film 161 may adhere to the top surface of the substrate 101 (by way of adhesion permitting grooves 115g as shall be detailed below) and it may also adhere to the bottom surface of the packaging of the driving circuit 150 (e.g., a packaged IC).

The pads 120 may be formed with one or more of various electrically conducting materials. Although not shown in FIG. 2, each pad may include a penetrateable connection barrier layer 125 (seen in FIG. 4).

A relatively hard and patterned insulation layer 115 is disposed on top of and aligned to the pads 120. The insulation layer 115 is patterned to include contact holes 115c respectively disposed over non-edge portions of to-be-contacted ones of the pads and adhesion-enhancing grooves 115g disposed in areas between the spaced apart pads.

More specifically, the contact holes 115c through the insulation layer 115 are formed to overlap top sides of respective one of the pads 120. In this instance, the insulation layer 115 is formed so as to protectively cover lateral edge portions of the pads 120 as shown in FIG. 2 so as to thereby prevent the edges of the pad 120 from being damaged, for example so as to initiate an undesired peel-off of the respective pad. More particularly, the formation of the insulation layer 115 with an appropriate anti-corrosion material (e.g., and inorganic dielectric) prevents damage to the side of the pad 120 caused by galvanic corrosion occurring during the process for manufacturing the display device 100 or various types of corrosion occurring after the manufacturing.

Figure 4:
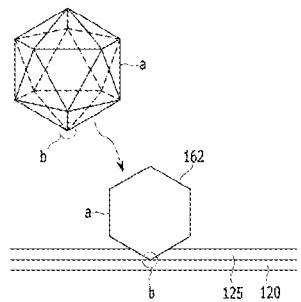
FIG. 4 shows a cross-sectional view of a conductive particle of an enlarged P area of FIG. 2.

The grooves 115g of the insulation layer 115 of FIGS. 3-4 are disposed between adjacent contact holes 115c. Referring to FIG. 2, the groove 115g penetrates through the insulation layer 115 from which a portion is removed by a thickness of the insulation layer 115. However, the present teachings are not restricted to this configuration. Various other configurations by way of which the grooves 115g can provide adhesion-enhancing functionality may be used.

That is, the groove 115g can be formed as a shape from which a part of the thickness of the insulation layer 115 is removed so that the adhesive within the ACF 160 can contact the top surface of the base substrate 101.

As shown in the top view of FIG. 3, the grooves 115g have closed-boundary shapes such as rectangles (or circles, etc.) which do not overlap with the areas of the contact holes 115c. That is, the interior sides of the grooves 115g are defined by a wrapping there-around of the surrounding insulation layer material 115. Since the adhesive within the ACF 160 can contact the top surface of the base substrate 101 through the grooves 115g, the bonding between the insulation layer 115 and the substrate 101 is improved to thereby help prevent the insulation layer 115 from being peeled off from the substrate 101. Although not shown, even when another member (e.g., another layer) is formed to be interposed between the insulation layer 115 and the base substrate 101, the bonding between the insulation layer 115 and its lower layer is reinforced by the adhesive that extends through the adhesion-enhancing grooves 115g to help prevent the insulation layer 115 from being stripped off.

The driving circuit 150 is disposed over its respective pads 120. The driving circuit 150 can be a chip type, and includes a main body 151 and a plurality of bumps 152 or other AFC penetrating terminals. The bumps 152 are attached to a bottom side of the main body 151. The anisotropic conductive film (ACF) 160 is disposed between the pads 120 and the driving circuit 150.

Referring to FIG. 2, the anisotropic conductive film 160 is formed (e.g., coated) on the insulation layer 115. The anisotropic conductive film 160 includes an insulation film material 161 and a plurality of normally spaced apart conductive particles 162 embedded in and distributed throughout the insulation film material 161. At least before curing of its adhesive, if not also after, the insulation film material 161 of the ACF 160 is penetrateable by the AFC penetrating terminals (e.g., bumps) 152 such that bottom ends of the penetrating terminals 152 can press against tops of the pads 120 while having conductive particles 162 interposed therebetween.

In other words, some of the conductive particles 162 are disposed in contacting engagement between a bottom conductive surface of the respective bump 152 and a conductive near-top surface of the respective pad 120. When the bump 152 and the pad 120 are pressurized through, for example, a thermal compression method, the conductive particles 162 are activated (e.g., insulative thin films around them are broken) so as to create conductive contacting engagement and the pad 120 is electrically connected to the respective bump 152 of the driving circuit 150.

Also, the driving circuit 150 is adhesively affixed to the substrate 101 through the pressurized and thermal activation of the anisotropic conductive film 160. In detail, the insulation film 161 is bonded to the insulation layer 115 and the driving circuit 150 so the driving circuit 150 is affixed to the substrate 101 and simultaneously electrically connected to its respective interconnect pads 120.

During the pressurized thermal activation process, some of the conductive particles 162 are received in the groove 115g together with the adhesive material of the ACF film 161. For this purpose, it is desirable for the groove 115g to be larger than one or more of the conductive particles 162 (or vice versa that the conductive particles 162 are assured to be smaller in diameter than the widths of the grooves 115g). Particularly, a depth of the groove 115g is greater than the diameter of the at least an average one of the conductive particles 162 and In one embodiment, the depth of the groove 115g can receive and contain therein at least two side-by-side ones of the conductive particles 162 as is shown in FIG. 2. Similarly, a width of the groove 115g is such that it can receive and contain therein at least two side-by-side ones of the conductive particles 162 as is shown in FIG. 2. In other words, when the conductive particles 162 are received into the groove 115g (for example during the pressurized thermal activation of the ACF film 161), at least a part of one conductive particle 162 that is a lower part of the particle can be received, and more preferably it is desirable to form the groove 115g to be larger than a predetermined size so that an entire volume of at least one, and more preferably a handful (e.g., 2-5) of the conductive particles 162 may be fully received in the containment volume of the groove 115g.

As described above, at least some of the conductive particles 162 interposed between the pad 120 and the bump 152 are caused to form an electrically contacting connection between the pad 120 and the bump 152 through the thermal compression method and the pad 120 is thus electrically connected to its corresponding part (152) of the driving circuit 150. While the distribution density of the conductive particles 162 within the pre-pressurized form of the ACF 161 needs to be sufficiently large to assure that at least one or a handful of the conductive particles 162 are trapped between the pad 120 and the bump 152 during the pressurized thermal activation process, it cannot be so large that it prevents the adhesion function of the ACF 161 to simultaneously take place. More specifically, the conductive particles 162 that are disposed in areas other than being interposed between the pad 120 and the bump 152 can interfere with the desired adhesive bonding of the driving circuit 150 to the substrate 101 if their sizes and volumetric density are too large. That is, when only the conductive particles 162 rather than some of the adhesive portion of the insulation film 161 are disposed in a specific bonding area between the driving circuit 150 and the insulation layer 115 or the conductive particles 162 are particularly gathered together (clustered) in that area, the bonding strength of the driving circuit 150 to the substrate 101 will be reduced due to the interference of the excessive concentration of conductive particles 162 in an area (e.g., 115g) where it is desirable for the adhesive to contact the one or both of the driving circuit 150 and the substrate 101.

However, in accordance with the present teachings, the contact holes 115c are spaced apart and the grooves 115g respective formed between the contact holes 115c such that during the pressurized thermal activation process, excess portion of the ACF material 161 can flow into the grooves 115g and excess ones of the conductive particles 162 may thus be received in the groove 115g thereby efficiently preventing a clustering of the conductive particles 162 where such a clustering can interfere with the adhesive bonding of the driving circuit 150 to the substrate 101. In one embodiment, and as shown in FIG. 2, the widths of the excess-receiving grooves 115g are at the same time small enough to prevent or inhibit the widths of the bumps 152 from easily entering the grooves 115g while the contact holes 115c have relatively gentle sidewall slopes and larger top widths so that the widths of the bumps 152 may be readily received in the contact holes 115c and guide toward centralized engagement with the contact pads 120 (and the interposed conductive particles 162.

A conductive particle according to an exemplary embodiment of the present disclosure will now be described with reference to FIG. 4.

FIG. 4 shows a cross-sectional view of a conductive particle of an enlarged P area of FIG. 2.

Referring to FIG. 4, an electrically insulative but penetrateable barrier layer 125 is formed on top of a conductive, next underlying layer of the pad 120 for example by way of surface oxidization or coating with an external contaminant material during formation of the pads 120 such that penetration through the penetrateable barrier layer 125 is needed to establish electrical contact.

In one embodiment, the conductive particle 162 are formed as sharp-edged or sharp-cornered regular 3-dimensional objects, for example those having a polyhedral shape whose plural sides each define a polygon. That is, two neighboring sides from among a plurality of sides of the polyhedral shape form a sharp intersection line (a), and the two sides meeting at the intersection line (a) each have a polygon shape and they form a sharp intersection angle where they meet. There are a plurality of such intersection lines (a), and plural ones of the intersection lines (also a) meet to form an intersection point (b) or sharp corner. There can be a plurality of such sharp intersection points (b). At least the intersection points (b) are such that they can easily penetrate the penetrateable barrier layer 125 as is shown in FIG. 4.

More specifically, FIG. 4 shows a cross-sectional shape of an exemplary conductive particle 162 in which the conductive particle 162 has such a polyhedral shape, for example, an icosahedral shape and it contacts the first electrode 120, and in the cross section it shows as a hexagon. The polyhedral shape of the conductive particle 162 has a uniform frame.

Surfaces showing the polyhedral shape of the conductive particle 162 are exposed to the outside, and their shapes can be shown when viewed from the outside. However, as described with reference to FIG. 2, when the insulation film 161 is formed between the conductive particles 162, the shape may be covered. In other words, the surfaces indicating the polyhedral shape of the conductive particle 162 can contact the insulation film 161.

At least a part of an intersection line (a) of the conductive particle 162 can penetrate and directly contact the first electrode 120. Further, the intersection point (b) at which the intersection lines (a) formed on the conductive particle 162 meet can directly contact the first electrode 120. FIG. 4 shows an exemplary embodiment in which the intersection point (b) of the conductive particle 162 is directly contacting the respective first electrode 120 and also penetrating the penetrateable barrier layer 125.

In other words, since the external shape of the conductive particle has a polyhedral configuration with relatively sharp edges, the compression pressure can be transmitted as an amplified force to a sharp portion of the conductive particle 162 that contacts the first electrode 120 after the barrier layer 125 has been formed. Resultantly, a compression loss problem generated by conventional circular conductive particles can be overcome because of the configuration characteristic of the conductive particles according to the present exemplary embodiment.

Although not shown, the conductive particle 162 may be formed as a plastic polymer core and a conductive, sharp-edged shell covering the plastic polymer core. The conductive, sharp-edged shell may be a metal film or a plated-on conductive plastic polymer.

The above-shaped conductive particles can be mass produced by using a microfluid control method. A template with a desired conductive particle shape can be manufactured by forming a micro-tube in an organic substrate by use of an FAB process. Here, the conductive particle that is like a template formed by injecting a raw material can be manufactured, which can be called a casting process, and will be described with reference to FIG. 6 to FIG. 10.

Figure 5:
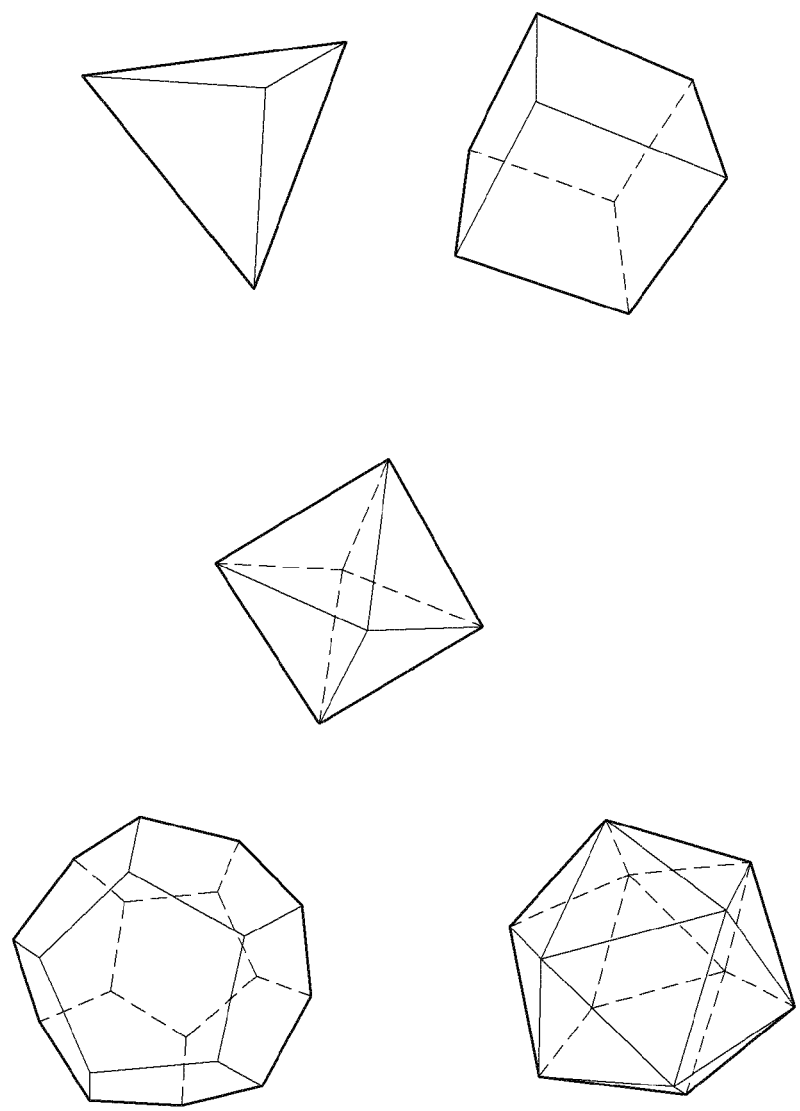
FIG. 5 shows a three-dimensional drawing of another example of a conductive particle according to an exemplary embodiment.

FIG. 5 shows a three-dimensional drawing for showing other examples of respective conductive particles according to other exemplary embodiment of the present disclosure.

More specifically, the conductive particles can be one of a tetrahedron, a hexahedron, an octahedron, a dodecahedron, and an icosahedron.

The above-described conductive particle are used to electrically connect the pad electrode and the driving circuit, and it is applicable to various types of electrical connections between circuit members without being restricted to the exemplary embodiment.

Figure 6:
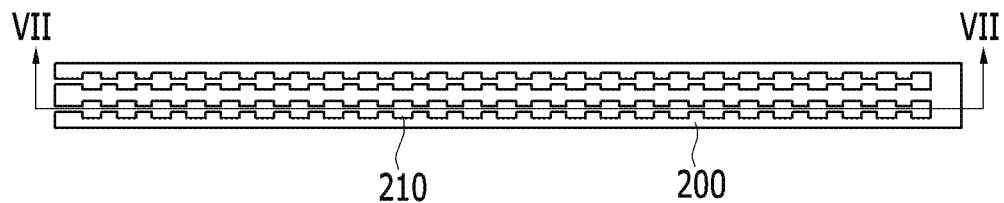
FIG. 6 to FIG. 11 show a method for manufacturing a plurality of substantially same conductive particles according to an exemplary embodiment.
Figure 7:
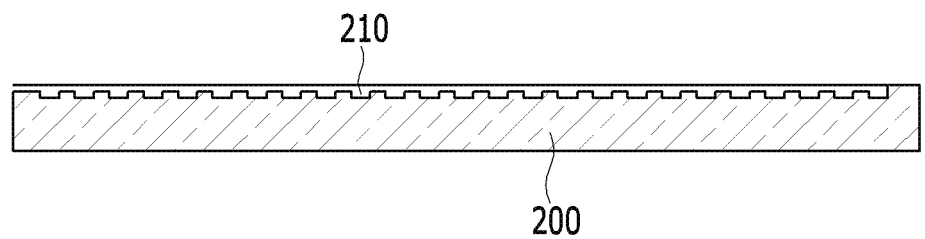
Figure 8:
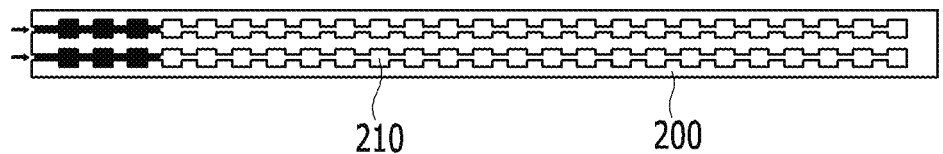
Figure 9:
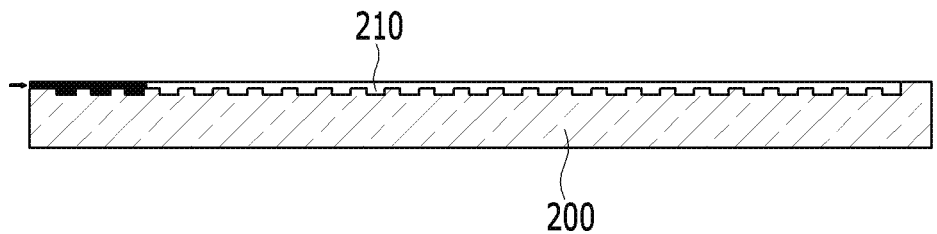
Figure 10:
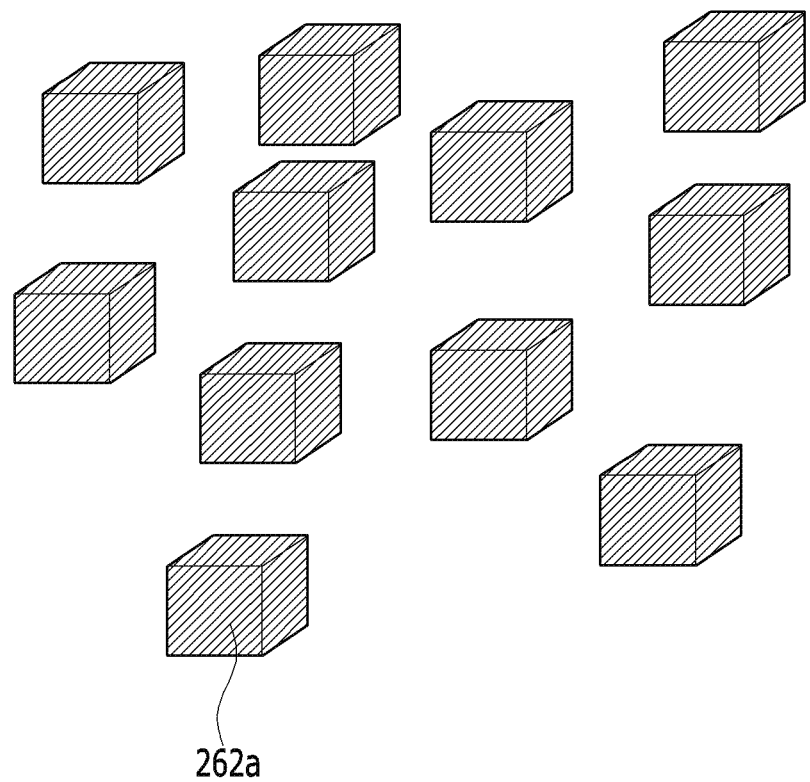
Figure 11:
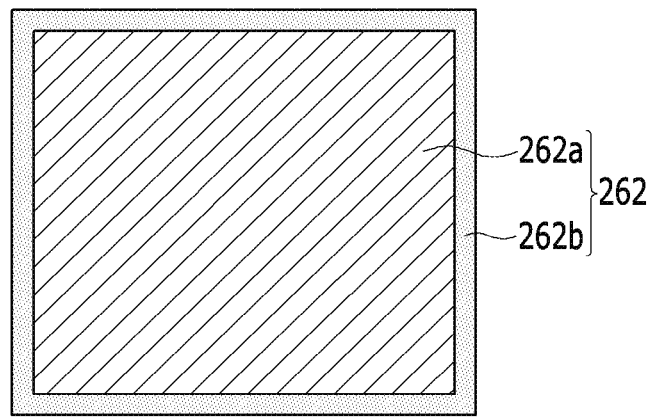

FIG. 6 to FIG. 11 show a method for mass production of conductive particles according to an exemplary embodiment. FIG. 6 shows a top plan view of patterned glass block 200 having a series of depressions (e.g., identical depressions) each of which is shaped for forming a corresponding conductive particle (162). FIG. 7 shows a cross-sectional view with respect to a line VII-VII of FIG. 6. FIG. 8 shows a top plan view for a serial injecting of a liquid raw (precursor) material, where a covering glass plate is not shown. FIG. 9 shows a cross-sectional view in a horizontal direction of FIG. 8 s the precursor injection process proceeds. FIG. 10 shows a perspective view of a plurality of polyhedral polymer cubes obtained from an exemplary embodiment of FIGS. 6-9 where the depressions 210 in the illustrated glass block 200 each have a substantially cubic shape. FIG. 11 shows a cross-sectional view of an exemplary conductive particle according to a present exemplary embodiment which has a plastic core.

Referring to FIG. 6 and FIG. 7, one or more injection receiving micro-tubes 210, each including repeated depressions (cavities) shaped according to a desired conductive particle shape are formed in the glass block 200. The micro-tubes 210 become casting-like templates of the desired conductive particle shape. The casting-like templates are sized in accordance with the dimensions of the targeted grooves (115g) and contact holes (115c) of the to be produced display device or other such interconnect using device. Here, the exemplary embodiment in which the conductive particle has a hexahedral shape will be described. However, the shape of the conductive particle is not restricted to the hexahedron, and as described above, the polyhedral shapes surrounded by the sides of a polygon are variable. In one embodiment, two glass blocks like 200 may be joined to define the desired injection receiving micro-tubes 210.

Referring to FIG. 8 and FIG. 9, the liquid raw material is injected along the micro-tube 210. The liquid raw material may include a hardenable polymer component for forming the plastic polymer core.

Referring to FIG. 10, when the injected liquid raw material is solidified (e.g., cured by heating), a polyhedral plastic polymer core 262a corresponding to the template of the desired conductive particle is formed and collected after breakage of the thinly interconnected copies. The polyhedral plastic polymer core 262a can be formed by separating a plurality of such plastic polymer cores 262a connected in the glass block 200 through a micro-tube type opening formed in the glass block 200. (In the case where two glass blocks are used to define the injection receiving micro-tubes 210, the glass blocks are separated after polymerization and the string of thinly interconnected copies is peeled out and broken into its separate copies of the plastic polymer cores 262a.

Next, referring to FIG. 11, a metal film 262b is formed by plating it to the shaped exterior of the plastic polymer core 262a. In this instance, a conductive particle 262 including the plastic polymer core 262a and the conforming metal skin 262b is formed. In an alternate embodiment, the outer layer of the plastic polymer core 262a is chemically treated or coated to define a conductive and conforming skin 262b. In either case, the conductive and conforming skin 262b is made of a material with sufficient hardness to penetrate the penetrateable barrier layer 125.

While this disclosure of invention has been provided in connection with what is presently considered to be practical exemplary embodiments, it is to be understood that the present teachings are not limited to the disclosed embodiments, but, on the contrary, the disclosure is intended to cover various modifications and equivalent arrangements included within the spirit and scope of the present teachings.

What is claimed is:
1. A display device comprising:
a first electrode;
a barrier layer disposed on the first electrode;
a conductive film disposed on the barrier layer and comprising a conductive particle; and
a second electrode disposed on the conductive film,
wherein the conductive particle comprises a polyhedral shape in which two neighboring sides among a plurality of sides form an intersection line, and two sides meeting on the intersection line form an angle.

2. The display device of claim 1, wherein at least a part of the intersection line in the conductive particle directly contacts the first electrode.

3. The display device of claim 2, wherein in the conductive particle, there are a plurality of intersection lines, and an intersection point at which the intersection lines meet directly contacts the first electrode.

4. The display device of claim 3, further comprising a plurality of conductive particles comprising the conductive particle, wherein the conductive films comprises an electrically insulation film disposed between the conductive particles.

5. The display device of claim 4, wherein surfaces showing the polyhedral shape of the conductive particle contact the insulation film.

6. The display device of claim 2, wherein the barrier layer is an oxide film.

* * * * *